(12) United States Patent
Takeuchi et al.

(10) Patent No.: US 6,255,759 B1
(45) Date of Patent: *Jul. 3, 2001

(54) SURFACE ACOUSTIC WAVE DEVICE AND METHOD OF DESIGNING THE SAME

(75) Inventors: Masao Takeuchi, Machida; Noritoshi Kimura, Tokyo, both of (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/258,816

(22) Filed: Feb. 26, 1999

(30) Foreign Application Priority Data

May 11, 1998 (JP) .................................. 10-145056
Feb. 1, 1999 (JP) .................................. 11-024024

(51) Int. Cl.⁷ .............................. H03H 9/64; H03H 9/145
(52) U.S. Cl. .......................................... 310/313 R
(58) Field of Search .......................... 310/313 R, 313 B, 310/313 D, 313 C; 29/25.35

(56) References Cited

U.S. PATENT DOCUMENTS

| | | | |
|---|---|---|---|
| 4,535,265 | 8/1985 | Kodama et al. | 310/313 C |
| 4,902,925 * | 2/1990 | Wright | 310/313 B |
| 4,910,839 * | 3/1990 | Wright | 310/313 B |
| 5,073,763 * | 12/1991 | Wright | 310/313 B |
| 5,212,420 | 5/1993 | Hickernell et al. | 310/313 D |
| 5,264,751 | 11/1993 | Dufilie et al. | 310/313 B |
| 5,270,606 | 12/1993 | Cho et al. | 310/313 D |
| 5,306,978 | 4/1994 | Yamanouchi et al. | 310/313 C |
| 5,426,339 * | 6/1995 | Wright | 310/313 D |
| 5,703,427 | 12/1997 | Solal et al. | 310/313 D |
| 5,831,492 * | 11/1998 | Solie | 333/193 |
| 5,896,071 * | 4/1999 | Dai et al. | 310/313 B |

FOREIGN PATENT DOCUMENTS

| | | | |
|---|---|---|---|
| 0 802 627 | 10/1997 | (EP) | H03H/9/145 |
| 3-70933 | 11/1991 | (JP) | H03H/9/145 |
| WO 98/27647 * | 6/1988 | (WO) | H03H/9/64 |

* cited by examiner

Primary Examiner—Thomas M. Dougherty
(74) Attorney, Agent, or Firm—Oblon, Spivak, McClelland, Maier & Neustadt, P.C.

(57) ABSTRACT

A method for manufacturing a surface acoustic wave device including forming a single-phase unidirectional transducer based on calculating frequency responses of the positive and negative conversion losses along a surface acoustic wave propagation direction by coupling-of-modes equations, where $A^+(x)$ and $A^-(x)$ are the mode amplitudes of the surface acoustic waves propagated respectively in the positive direction (forward direction) and negative direction (backward direction) of the x axis and where boundary conditions of the initial and final analytical points are respectively expressed by $A^+(0)=0$ and $A^-(L)=0$. The method includes setting $A^+(0)=0$ (or $A^-(L)=0$) as a boundary condition, setting $A^-(0)$ (or $A^+(L)$) to an arbitrary value as an initial value of $A^-(0)$ (or $A^+(L)$), and calculating coupling-mode-equations while repeatedly altering $A^-(0)$ (or $A^+(L)$) until $A^-(L)=0$ (or until $A^+(0)=0$).

12 Claims, 9 Drawing Sheets

SURFACE ACOUSTIC WAVE DEVICE AND METHOD OF DESIGNING THE SAME

BACKGROUND OF THE INVENTION

1. Technical Fields

The present invention concerns an surface acoustic wave device (e.g., surface acoustic wave filter, surface acoustic wave resonator, etc.) as well as a method for its design. In particular, it concerns an surface acoustic wave device that utilizes a single-phase unidirectional transducer, which serves a function of reversing the directionality of an surface acoustic wave as well as a method for its design.

2. Background Technology

In recent years, mobile communication terminals, which are led by mobile phones, have rapidly entrenched themselves. With regard to portability, a compact size and light weight are especially important requirements for such terminals. In order to reduce the size and weight of the terminals, it is essential to reduce the sizes and weights of electronic components included in it, and therefore, surface acoustic wave devices (surface acoustic wave filters), which are advantageous for such attempts to reduce the size and weight, are being used extensively in high-frequency components and intermediate-frequency components of the terminals. The surface acoustic wave device is characterized by a constitution wherein cross-fingered electrodes (interdigital electrodes) are formed on the surface of a piezoelectric substrate as transducers for exciting and receiving surface acoustic waves.

Unidirectional transducers, namely transducers wherein the energy level of surface acoustic waves emitted on one side is relativistically elevated, have been proposed for surface acoustic wave devices for minimizing the bidirectional losses of transducers. The unidirectional transducers can be roughly classified into a triple-phase unidirectional transducer and a single-phase unidirectional transducer. Practical implementations of the former are accompanied by difficulties since an external phase transfer device, etc. are required for generating three phases, whereas the latter is advantageous in that it requires no external phase transfer device, etc.

As far as unidirectional transducers, which can be prepared by photolithographic procedures similar to those for preparing conventional transducers, one which uses the asymmetry of its electrode structure or the internal reflection attributed to a mass-loading effect, one which uses the reflection by a floating electrode, one which utilizes the anisotropy of a substrate (natural single-phase unidirectional transducer), etc. have heretofore been proposed. These single-phase unidirectional transducers are directionalized by concentrating surface acoustic wave energies in the forward direction while phase differentials are being maintained between excitation waves and reflection waves in such a way that they will abide in coinciding phases in the forward direction (default direction or positive direction) and non-coinciding phases in the opposing direction (counterdefault direction or negative direction).

An example of a single-phase unidirectional transducer, which uses a floating electrode, is mentioned in Japanese Patent Application Publication No. Kokai Sho 60[1985]-236312. The floating electrode-internal reflection type unidirectional surface acoustic wave transducer mentioned in said patent publication is obtained by configuring a floating electrode, which is coupled with neither an anode nor a cathode within the gap of a cross-fingered electrode matrix wherein the length between the center of the anode and cathode is $\lambda/2$ ($\lambda$ is the wavelength at the central frequency) in such a way that its central position will not coincide with the central position between the anode and cathode. As FIG. 9 indicates, furthermore, Yamanouchi and Furuyashiki ("Acoustic Surface Wave Filters Using Internal Reflection Type of Unidirectional Transducers," *Technical Report, Institute of Electronics and Communication Engineers,* US84-18, pp. 95–100, 1984) propose the simultaneous insertions of the open floating electrode (62a) and the short-circuited floating electrode (62b) between the positive and negative excitation electrodes (61a) and (61b), respectively, for the purpose of obtaining a more accentuated unidirectional profile. FIG. 11A shows the relationship between the normalized frequency of the unidirectional transducer, the constitution of which is shown in FIG. 9 (frequency normalized to the central frequency) and its conversion loss. The conversion profile shown in FIG. 11A was obtained by using 128° YX-LiNbO$_3$ as a piezoelectric substrate while the electrode aperture length was being designated at 40 $\lambda$ ($\lambda$: Surface acoustic wave wavelength at the central frequency). The solid curve and dotted curve in FIG. 11A respectively indicate the conversion losses in the forward and backward directions of the unidirectional transducer. The differential between the conversion loss in the forward direction and the conversion loss in the backward direction signifies the magnitude of unidirectionality. In FIG. 11A, the unidirectionality is maximized in the vicinity of the central frequency, based on which a loss—loss filter can be actualized.

SUMMARY OF THE INVENTION

A single-phase unidirectional transducer can be easily prepared by configuring a floating electrode between the electrode fingers of an ordinary cross-fingered electrode matrix, and therefore, it can be prepared by photolithographic procedures similar to those for preparing ordinary converters. If the number of transducer finger pairs is lowered for broadening the passband when the reflection by the floating electrode is utilized, however, the reflection effect diminishes, resulting in the deterioration of the unidirectional profile, and the rectangularity of the passband also deteriorates.

Incidentally, when an surface acoustic wave transducer is constituted by a cross-fingered electrode matrix with a uniform aperture length, its frequency response is rigidly determined and cannot be further improved. For this reason, it is known that the constitutions of the electrode fingers can be variously weighted for flattening the frequency response within the passband (for securing the rectangularity of the passband) or for further improving the suppression of the side lobe (*Acoustic Wave Device Technology Handbook,* Ohm Press, p. 195). Concrete examples of such weighting measures include the weighting of the aperture length, weighting of the excitation intensity, and the combination of these weighting measures. In the case of a unidirectional transducer which uses internal reflection, too, it may seem feasible that its unidirectional profile and the rectangularity of its passband can be improved by weighting various parameters of an excitation source or by weighting various parameters of a floating electrode which serves as a reflection source.

The design of a unidirectional transducer the propagation direction of which is weighted, however, is extremely complex. The Smith equivalent circuit method has heretofore been and is still being used for designing an surface acoustic wave transducer. When a unidirectional transducer (e.g., single-phase unidirectional transducer which uses a floating electrode) is designed, rather complicated procedures are required for handling said floating electrode, and neither the determinations of its equivalent circuit parameters nor the constitutions of such equivalent circuits are simple matters. In recent years, therefore, the design based on the coupling-of-modes (COM) theory has attracted attention. Even a unidirectional transducer, which possesses a floating electrode, can be easily analyzed and designed in high precision based on the application of the coupling-of-modes theory (C. S. Hartmann, et al., Proc. *IEEE Ultrason. Symp.*, pp. 40–45 (1982) [Reference 1]; Takeuchi, et al., *Proceedings from the 23rd EM Symposium*, pp, 101–110 (1994) (Reference 2]). The coupling-of-modes theory is therefore being used in an extremely high frequency for the analyses and designs of single-phase unidirectional transducers.

Closed form solutions of coupling-of-modes equations can, however, be obtained for transducers of the usual shape alone based on the aforementioned methods mentioned in References 1 and 2. As far as transducers with non-usual shapes are concerned, the coupling-of-modes parameter of the coupling-of-modes equation can be obtained in a closed form based on the method mentioned in M. Takeuchi, et al., *IEEE Trans. UFFC*-40, No. 6, pp. 648–658 (1993) [Reference 3]. Transducers with weighted excitation source distributions or reflection source distributions, however, an extremely difficult to analyze even by this method.

The following method has therefore been utilized for designing a weighted unidirectional transducer in the prior art: Based on the assumption that a transducer which serves as a designing object is a cluster of many cascade-connected cells in multiple steps the respective coupling-of-modes parameters of which can be approximated to be constant, the coupling-of-modes parameters for the respective cells are calculated for determining the constitutions of electrode fingers and gaps between the electrode fingers necessary for obtaining desired performance. Such a design method, however, is extremely complicated, and since its forecasting prospect is uncertain, it has been difficult to implement it on an industrial basis.

Thus, there has been no practical designing method wherein various profiles such as the rectangularity, bandwidth, unidirectionality, etc. can be freely and easily controlled.

One objective of the present invention is to broaden the passband of a single-phase unidirectional transducer while the rectangularity of said passband is being maintained and to achieve the unidirectionality over a broad passband. Another objective of the present invention is to provide a method that enables a simple design of such a single-phase unidirectional transducer.

The aforementioned problems can be solved by any one of the following constitutions (1) through (8):

(1): A method for designing an surface acoustic wave device with the following characteristics: In a method for designing an surface acoustic wave device wherein a single-phase unidirectional transducer is formed above a piezoelectric substrate, When the frequency responses of the positive and negative conversion losses along the surface acoustic wave propagation direction are calculated by coupling-of-modes equations expressed by the following:

$$\frac{dA^+(x)}{dx} = -j\kappa_{11}A^+(x) - j\kappa_{12}e^{j2\delta x}A^-(x) + j\zeta e^{j\delta x}V \quad (1a)$$

$$\frac{dA^-(x)}{dx} = j\kappa_{12}^* e^{-j2\delta x}A^+(x) + j\kappa_{11}A^-(x) - j\zeta^* e^{-j\delta x}V \quad (1b)$$

$$\frac{dI(x)}{dx} = -pj\zeta^* e^{-j\delta x}A^+(x) - pj\zeta e^{j\delta x}A^-(x) + qj\omega CV \quad (1c)$$

(in formulas (1a), (1b), and (1c) above, $A^+(x)$ and $A^-(x)$ signify the mode amplitudes of the surface acoustic waves propagated respectively in the positive direction (forward direction) and negative direction (backward direction) of the x axis, which serves as the surface acoustic wave propagation axis; V signifies the applied voltage for the excitation electrode; I(x) signifies the current; moreover, $\kappa_{11}$, $\kappa_{12}$, $\zeta$, C, and $\delta$ respectively signify the self-coupling coefficient, mutual-coupling coefficient, transduction coefficient, electrostatic capacitance per unit length, and the phase mismatching factor; the combinations of p and q in formula (1c) (p,q) include (2,1), (−2,−1), (4, 1), and (−4,−1) for the purpose of determining the excitation source distribution and reflection source distribution of the single-phase unidirectional transducer.)

At least one member selected from among the self-coupling coefficient $\kappa_{11}$, intermode coupling coefficient $\kappa_{12}$, transduction coefficient $\zeta$, and the phase mismatching factor $\delta$ is a function of x while x=0 through L holds in the analytic range of the aforementioned coupling-of-modes equations and while the boundary conditions of the initial and final analytical points are being respectively expressed by $A^+(0)=0$ and $A^-(L)=0$.

A process whereby $A^+(0)=0$ and an arbitrary value are initially designated as the boundary value and the initial value of $A^-(0)$, respectively, followed by the analyses of the aforementioned formulas (1a) and (1b) while $A^-(0)$ is being repeatedly altered until $A^-(L)=0$ is achieved, and whereby the conversion losses are calculated by computing the admittance by the aforementioned formula (1c) upon the attainment of $A^-(L)=0$ may be utilized, or a process whereby $A^-(L)=0$ and an arbitrary value are initially designated as the boundary value and the initial value of $A^+(L)$, respectively, followed by the analyses of the aforementioned formulas (1a) and (1b) while $A^+(L)$ is being repeatedly altered until $A^+(0)=0$ is achieved, and whereby the conversion losses are calculated by computing the admittance by the aforementioned formula (1c) upon the attainment of $A^+(0)=0$ may be utilized.

(2): The method for designing an surface acoustic wave device specified in the aforementioned Embodiment (1) wherein at least either the mutual-coupling coefficient $\kappa_{12}$ or the transduction coefficient $\zeta$ is a function of x in the aforementioned formulas (1a), (1b), and (1c).

(3): The method for designing an surface acoustic wave device specified in the aforementioned Embodiment (2) wherein the aforementioned function of x is characterized by a sin x/x type.

(4): The method for designing an surface acoustic wave device specified in the aforementioned Embodiment (3) wherein the function of the sin x/x type involves a disparity between the mutual-coupling coefficient $\kappa_{12}$ and the transduction coefficient $\zeta$.

(5): The method for designing an surface acoustic wave device specified in the aforementioned Embodiment (4) wherein the mutual-coupling coefficient $\kappa_{12}$ is a function of a sin(mπx)/mπx type while m and n are each real numbers of 2 or larger and while m≧INT(n/2)+1 (wherein INT(n/2) signifies the integer segment of n/2) holds and wherein the transduction coefficient ζ is a function of a sin(nπx)/nπx type.

(6): An surface acoustic wave device that is designed by the method for designing an surface acoustic wave device specified in the aforementioned Embodiment (1).

(7): An surface acoustic wave device wherein a single-phase unidirectional transducer is formed on a piezoelectric substrate and wherein multiple frequency points at which a reflection phase of −90° is achieved exist within the stop band with regard to the internal reflection characteristics of said single-phase unidirectional transducer.

(8): An surface acoustic wave device wherein a single-phase unidirectional transducer is formed on a piezoelectric substrate and wherein the variance of the reflection phase exceeds 360° within the stop band of the internal reflection characteristics of said single-phase unidirectional transducer.

EXPLANATION OF DESIRABLE APPLICATION EMBODIMENTS

Method for analyzing the coupling-of-modes equations

Figure 1:
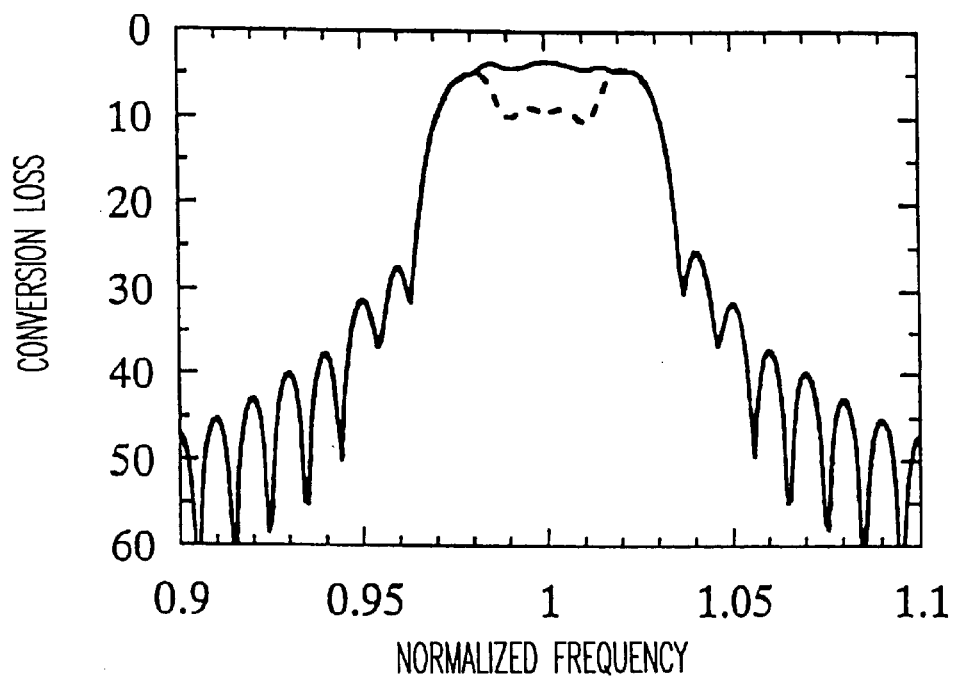
FIG. 1 is a graph that shows the conversion characteristics of a unidirectional transducer whose mutual-coupling coefficient and transduction coefficient have been weighted.

The coupling-of-modes equations of an surface acoustic wave transducer are expressed by the following formulas (1a), (1b), and (1c):

$$\frac{dA^+(x)}{dx} = -j\kappa_{11}A^+(x) - j\kappa_{12}e^{j2\delta x}A^-(x) + j\zeta e^{j\delta x}V \quad (1a)$$

$$\frac{dA^-(x)}{dx} = j\kappa_{12}^* e^{-j2\delta x}A^+(x) + j\kappa_{11}A^-(x) - j\zeta^* e^{-j\delta x}V \quad (1b)$$

$$\frac{dI(x)}{dx} = -pj\zeta^* e^{-j\delta x}A^+(x) - pj\zeta e^{j\delta x}A^-(x) + qj\omega CV \quad (1c)$$

(in formulas (1a), (1b), and (1c) above, $A^+(x)$ and $A^-(x)$ signify the mode amplitudes of the surface acoustic waves propagated respectively in the positive direction (forward direction) and negative direction (backward direction) of the x axis, which serves as the surface acoustic wave propagation axis; V signifies the applied voltage for the excitation electrode; I(x) signifies the current; moreover, $\kappa_{11}$, $\kappa_{12}$, $\zeta$, C, and $\delta$ respectively signify the self-coupling coefficient, mutual-coupling coefficient, transduction coefficient, electrostatic capacitance per unit length, and the phase mismatching factor; the combinations of p and q in formula (1c) (p,q) include (2,1), (−2,−1), (4, 1), and (−4,−1).

In the aforementioned respective formulas, the self-coupling coefficient $\kappa_{11}$, mutual-coupling coefficient $\kappa_{12}$, transduction coefficient, $\zeta$, electrostatic capacitance per unit length C, and the phase mismatching factor $\delta$ are generally constants. The $\kappa_{12}$ and $\zeta$ values are real numbers in the case of an conventional bidirectional transducer, whereas they are complex numbers in the case of a unidirectional transducer.

Solutions of the aforementioned respective formulas can be easily obtained if the respective parameters such as $\kappa_{11}$, $\kappa_{12}$, $\zeta$, $\delta$, etc. are constant, but it is impossible to obtain a closed solution when at least one parameter is a function of x. In the present invention, therefore, numerical analyses are carried out based on the method explained below.

Figure 10:
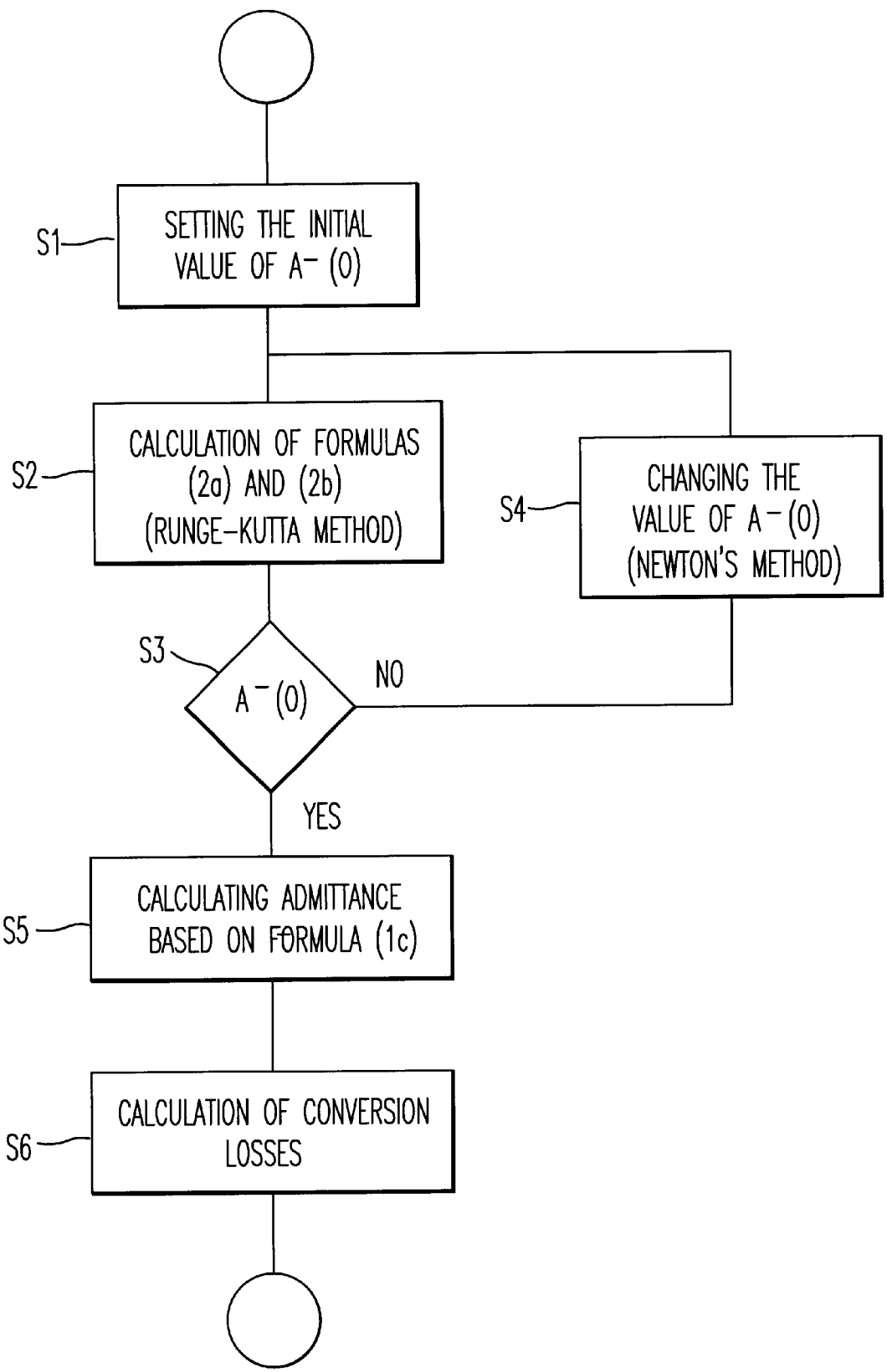
FIG. 10 is a flowchart provided for explaining the method for analyzing the coupling-of-modes equations.

When x=0 through L are assumed for the analytic range of the aforementioned coupling-of-modes equations, the boundary conditions of the initial and final analytical points to be satisfied can be respectively expressed by $A^+(0)=0$ and $A^-(L)=0$. The analysis method shown in the flowchart of FIG. 10 is employed in the present invention for solving such a two-point boundary-value problem.

In this analysis method, $A^+(0)=0$ is initially designated as a boundary value, whereas an arbitrary value is designated as the initial value of $A^-(0)$ (Step S1). Next, the formulas (1a) and (1b) are calculated from x=0 to x=L by using the Runge-Kutta method (Step S2). In other words, the $A^+(x+\Delta x)$ and $A^-(x+\Delta x)$ of a case where the gain of x is defined as Δx are calculated repeatedly by the Runge-Kutta method until x+Δx=L is achieved. When $A^-(L)=0$ cannot be achieved (Step S3), the value of $A^-(0)$ is altered by using the Newton method (Step S4), and after Step S2 has been resumed, the values are recalculated. When $A^-(L)=0$ is achieved at Step S2 (Step S3), it becomes possible to calculate the admittance by the aforementioned formula (1c) (Step S5) and to calculate the conversion loss (Step S6). In other words, an arbitrary value is first designated as the initial value of $A^-(0)$ in the present invention, and calculations are repeated while $A^-(0)$ is being varied until an $A^-(0)$ value which satisfies the final point of boundary condition $[A^-(L)=0]$ is discovered. The same calculating procedures are applied to all the frequencies which are the objects of analysis for calculating the frequency characteristics of the conversion loss.

The calculating direction, furthermore, may be reversed. In other words, x: 0→L was assumed in the aforementioned explanation but the calculations may also be carried out by assuming x: L→0. In such a case, A⁻(L)=0 is first designated as a boundary value, whereas an arbitrary value is designated as the initial value of A⁺(L). Next, the calculation is initialized from x=L, and formulas (1a) and (1b) are calculated until x+Δx=0 are achieved. In this case, the gain Δx is negative. The procedures for altering the A⁺(L) and recalculating procedures are then repeated until A⁺(0)=0 is achieved.

The Runge-Kutta method, which can be commonly used, was cited as a method for numerically analyzing differential equations in the aforementioned explanations, but it is also possible to use other methods. Likewise, methods other than the Newton method may also be used at Step S4. The Runge-Kutta method and Newton method, however, will be used in all the application examples of the present invention.

Figure 9:
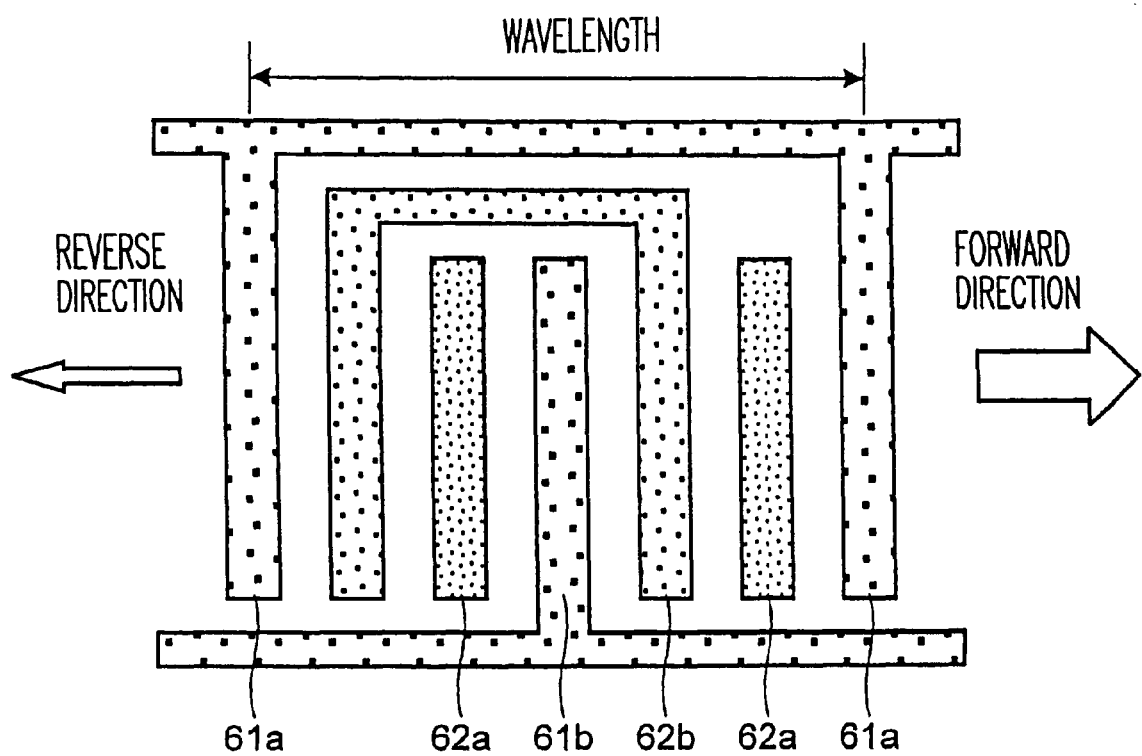
FIG. 9 is a diagram that shows a plane view of the constitution of a floating electrode-type unidirectional transducer.
Figure 11A:
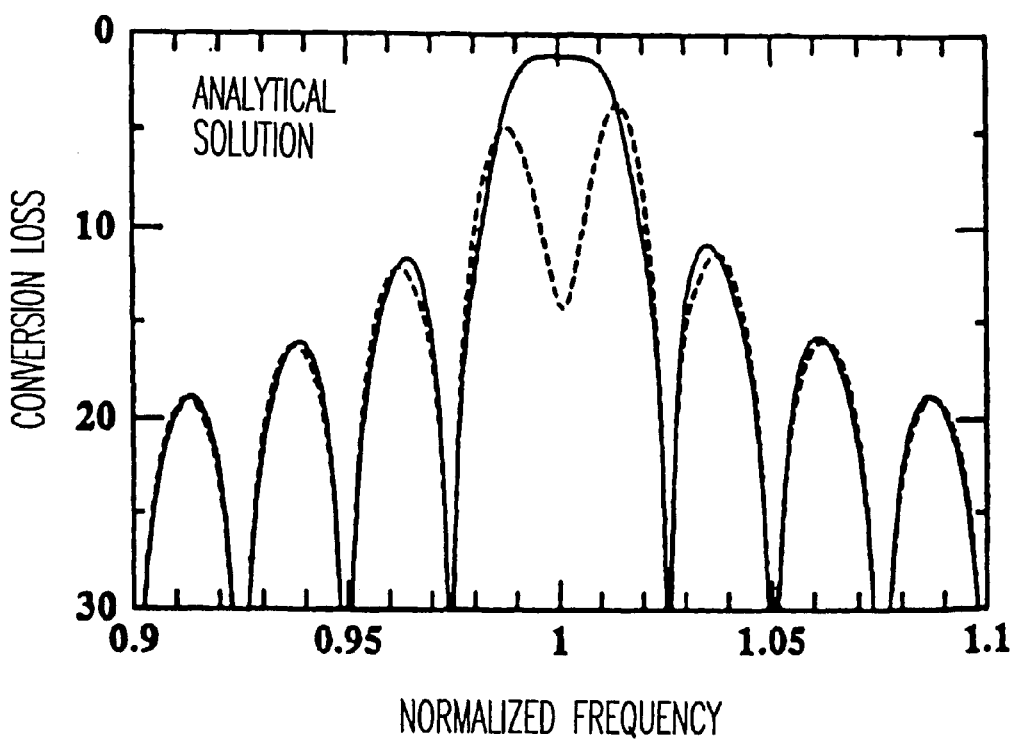
FIGS. 11A and 11B are graphs that show the conversion characteristics of an unweighted unidirectional transducers. The results of FIG. 11A are obtained by an analysis method of the prior art, whereas the results of FIG. 11B are obtained by analyzing the coupling-of-modes equations based on the method shown in FIG. 10.

The conversion loss of the floating electrode-type unidirectional transducer characterized by the constitution shown in FIG. 9 was calculated by using this analysis method for investigating the relationship between the frequency normalized to the central frequency of the surface acoustic waves and the conversion loss. The substrate of this transducer was made of 128° YX-LiNbO$_3$, whereas its wavelength at the central frequency (λ) was 40 μm, whereas its total length was 40 λ, whereas its aperture length (crossing width) was 30 λ. The range of the analysis object frequency was between 0.9 and 1.1 in terms of the normalized frequency. The results are summarized in FIG. 11B. For comparative purposes, the results of a case where the corresponding characteristics of an identical floating electrode-type unidirectional transducer were calculated based on the aforementioned method shown in Reference 3 are shown in FIG. 11A. When the numerical solutions shown in FIG. 11B (method of the present invention) and the analyzed solutions shown in FIG. 11A (method of the prior art) are compared, it can be seen that they coincide with one another extremely well. It can therefore be stated that the analysis method shown in FIG. 11 can be used for designing an surface acoustic wave device, as in the case of the method of the prior art.

Figure 11B:
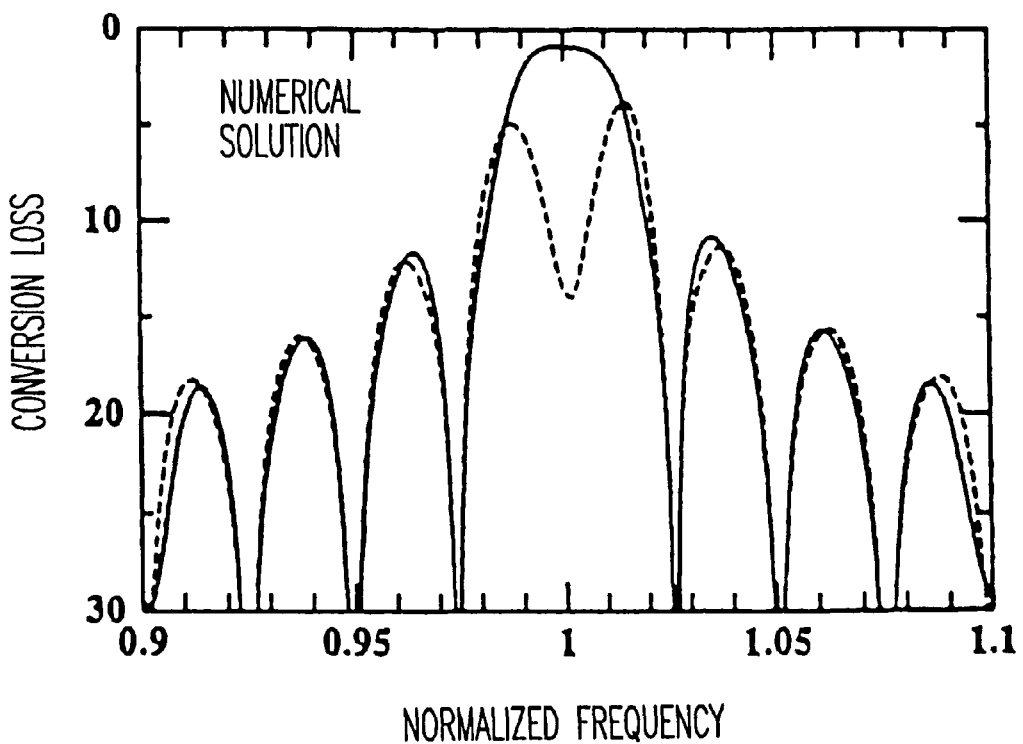

The results of FIG. 11B were obtained by designating the gain of the x axis at five wavelength equivalents and the frequency point number (number of points to be analyzed within the analysis frequency range) at 200, but these conditions can be variously designated adventitiously. When the gain of the x axis is no more than five wavelength equivalents, the precision is sufficient, and when the gain is one wavelength equivalent or less, the numerical solution and analytic solution perfectly coincide with one another. Moreover, a complex number with real part of 2.1 and imaginary part of 1.2 was used as an initial value of A⁻(0), but arbitrary values can be designated as initial values to be inputted at step S1 in FIG. 10. When the present inventors proceeded to analyze various transducers based on the aforementioned analysis method, stable and favorable convergent solutions were obtained over a broad frequency band by using arbitrary initial values without altering the initial values in frequency-specific fashions. In other words, the time elapsed until the completion of calculation was stable regardless of the initial value of A⁻(0) designated at the onset. Although previously unknown, therefore, the surface acoustic wave coupling-of-modes equations may be considered to be so-called "unstiff equations." The time required for calculation was approximately 9 sec. in the case of the combination of a commercial personal computer (equipped with a Pentium II 266 MHZ processor) and DIGITAL Visual Fortran Compiler, which is practically feasible for device designs.

The weightings of the transduction coefficient and mutual-coupling coefficient

The single-phase unidirectional transducer of the present invention is characterized by the weighting of at least one coupling-of-modes parameter for the coupling-of-modes equations, more preferably at least either the mutual-coupling coefficient or the transduction coefficient, or most preferably both, along the propagating direction of the surface acoustic waves (hereinafter referred to simply as the "x axis direction"). Based on such weighting measures, the side lobe can be suppressed while the passband is being broadened and the rectangularity of the passband being improved. Moreover, unidirectionality can be achieved over a broad frequency range within the passband. The transduction coefficient ζ(x) is a parameter which determines the excitation source distribution, whereas the mutual-coupling coefficient $\kappa_{12}(x)$ is a parameter which determines the reflection source distribution.

As far as concrete weighting functions are concerned, functions of the sin x/x type are desirable. When one with the sin x/x type is employed as a weighting function, the passband can be broadened while the rectangularity of the passband and the unidirectionality are being maintained.

In the following, a concrete example of unidirectional transducer weighted thus in the sin x/x type will be explained.

As has been mentioned above, the respective parameters in the aforementioned formulas (1a), (1b), and (1c) are generally constants, but in order to weight the excitation source distribution and reflection source distribution of the unidirectional transducer along the surface acoustic wave propagation axis x direction, the self-coupling coefficient $\kappa_{11}$, mutual-coupling coefficient $\kappa_{12}$, transduction coefficient ζ, and the phase mismatching factor δ are assumed to be functions of x, and accordingly, they are expressed as $\kappa_{11}(x)$, $\kappa_{12}(x)$, ζ(x), and δ(x), respectively. When the transduction coefficient ζ is assumed to be a function of x, furthermore, the electrostatic capacitance C per unit length also becomes a function of x, and it is expressed as C(x). The coupling-of-modes equations in this case are expressed by the following formulas (2a), (2b), and (2c):

$$\frac{dA^+(x)}{dx} = -j\kappa_{11}(x)A^+(x) - j\kappa_{12}(x)e^{j2\delta(x)x}A^-(x) + j\zeta(x)e^{j\delta(x)x}V \quad (2a)$$

$$\frac{dA^-(x)}{dx} = j\kappa_{12}^*(x)e^{-j2\delta(x)x}A^+(x) + j\kappa_{11}(x)A^-(x) - j\zeta^*(x)e^{-j\delta(x)x}V \quad (2b)$$

$$\frac{dI(x)}{dx} = -pj\zeta^*(x)e^{-j\delta(x)x}A^+(x) - pj\zeta(x)e^{j\delta(x)x}A^-(x) + qj\omega C(x)V \quad (2c)$$

The transduction coefficient ζ(x), mutual-coupling coefficient $\kappa_{12}(x)$, and the electrostatic capacitance C(x) can be hereby expressed by the following formulas (3a), (3b), and (3c):

$$\zeta(x)=|\zeta|W_1(x)e^{j\psi} \quad (3a)$$

$$\kappa_{12}(x)=|\kappa_{12}|W_2(x)e^{j2\phi} \quad (3b)$$

$$C(x)=C|W_1(x)| \quad (3c)$$

(in the aforementioned formulas (3a), (3b), and (3c), $W_1(x)$ and $W_2(x)$ are each weighting functions in the x axis direction).

Figure 8:
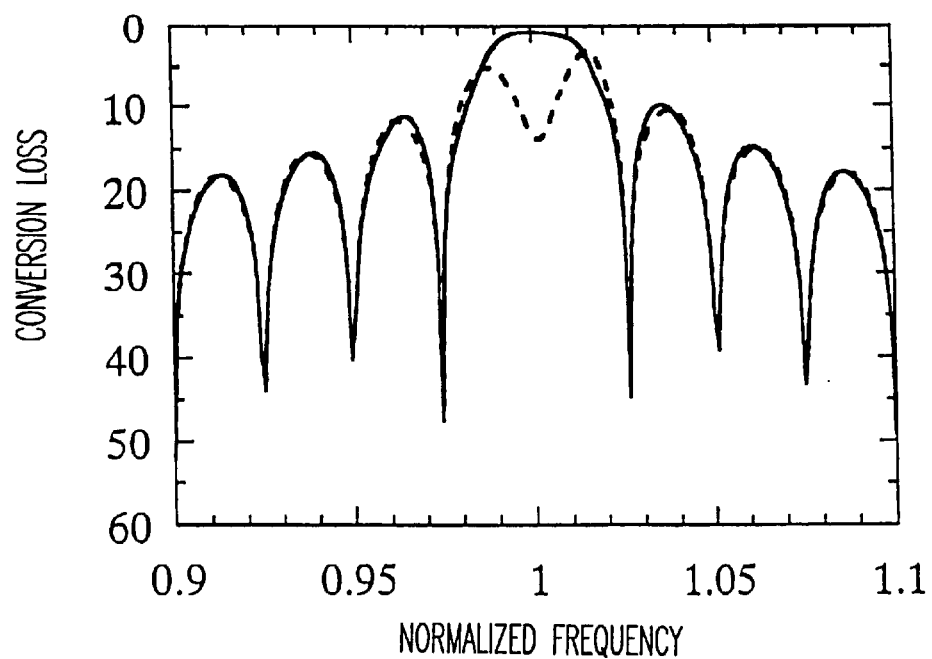
FIG. 8 is a graph that shows the conversion characteristics of an unweighted unidirectional transducer, which have been obtained by analyzing the coupling-of-modes equations based on the method shown in FIG. 10.

In the aforementioned formulas (3a), (3b), and (3c), $W_1(x)$ and $W_2(x)$ are each weighting functions in the x axis direction. Moreover, $\kappa_{12}$, ζ, and C are respectively the mutual-coupling coefficient, transduction coefficient, and electrostatic capacitance per unit length of the transducer before they are weighted by these functions (transducer the conversion characteristics of which are shown in FIG. 8). φ and ψ are the argument of $\kappa_{12}$ and $\zeta$, respectively. The conversion characteristics shown in FIG. 8, furthermore, are identical to the conversion characteristics explained previously with reference to FIG. 11B except that the gain of x (i.e., Δx) is calculated as one wavelength equivalent (five wavelength equivalents for the Δx in FIG. 11B). In FIG. 8, furthermore, the conversion loss scale is altered for further deambiguating the degree of suppression of the side lobe.

First, an application example in which both transduction coefficient and mutual-coupling coefficient of the unidirectional transducer the conversion characteristics of which are shown in FIG. 8 have been weighted according to the sin x/x type will be explained. As far as the weighting application examples of the present specification are concerned, the conversion characteristics were analyzed by the analysis method shown in FIG. 10 and then verified by using an actual transducer. The self-coupling coefficient $\kappa_{11}(x)=0$ was assumed during the analyses for enabling the standardization by the central frequency.

Figure 2:
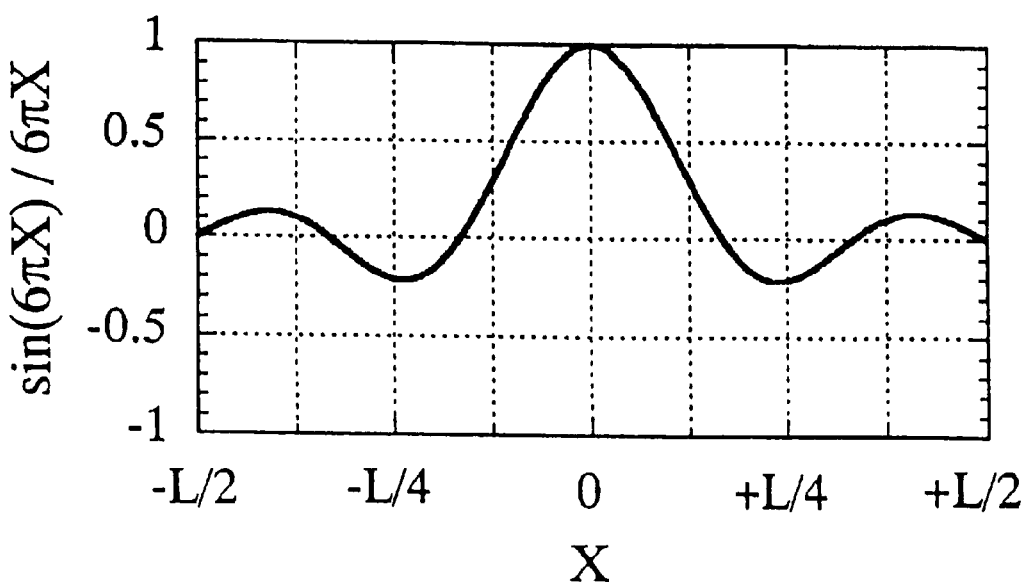
FIG. 2 is a graph that shows a weighting function.

When the weighting function $W_1(x)$ for the transduction coefficient $\zeta(x)$ and the weighting function $W_2(x)$ for the mutual-coupling coefficient $\kappa_{12}(x)$ are both characterized by sin $(6\pi X)/6\pi X$, the conversion characteristics shown in FIG. 1 are obtained. In a unidirectional transducer thus weighted, the concomitantly used substrate and the wavelength λ at the central frequency are identical to those of the unidirectional transducer the conversion characteristics of which are shown in FIG. 8 (i.e., unweighted transducer) except that the transducer length (L) and the aperture length are designated at 100 λ and 50 λ, respectively. Moreover, X is a coordinate the origin of which corresponds to the center of the analysis range (position of L/2). In other words, X=x–L/2 holds. The weighting function sin($6\pi X$)/$6\pi X$ is shown in FIG. 2.

When FIG. 1, which shows the conversion characteristics of the example of the present invention, and FIG. 8, which shows the conversion characteristics of the prior art, are compared, it can be seen that not only is the side lobe suppressed in FIG. 1 but that the passband is also broadened. It can also be seen that unidirectionality is achieved over a broad range within the passband.

Figure 3:
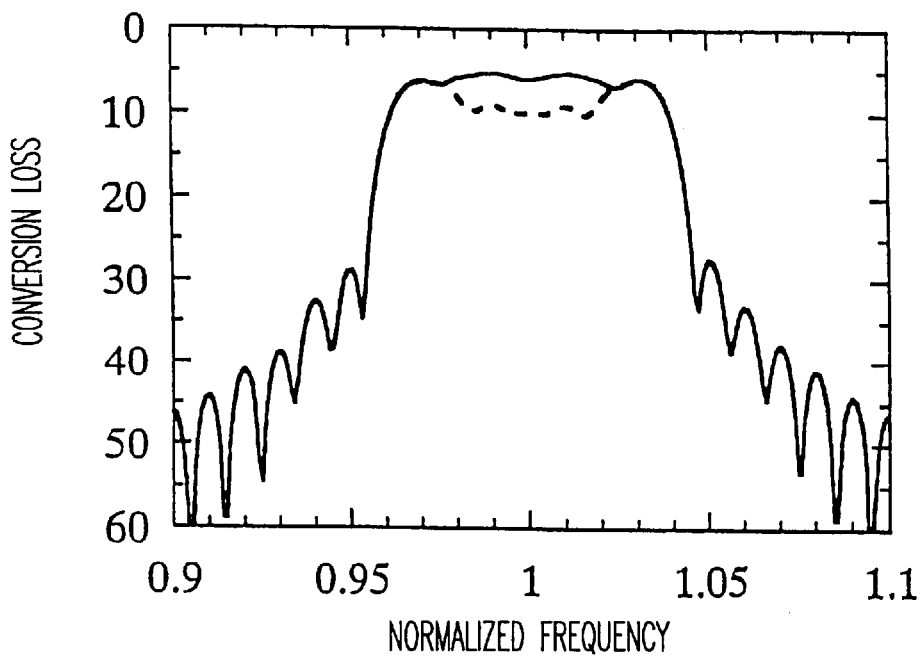
FIG. 3 is a graph that shows the conversion characteristics of another unidirectional transducer whose mutual-coupling coefficient and transduction coefficient have been weighted.

The conversion characteristics of a case where the wavelength λ, transducer length, and the aperture length were designated identically as in FIG. 1 and where the weighting functions $W_1(x)$ and $W_2(x)$ were both designated at sin $(8\pi X)/8\pi X$ are shown in FIG. 3. In FIG. 3, too, the side lobe is suppressed while the passband is being broadened in comparison with FIG. 8, and furthermore, unidirectionality is achieved over a passband broader than that in FIG. 1.

The results shown in FIGS. 1 and 3 indicate that, when the $\zeta(x)$ and $\kappa_{12}(x)$ are weighted according to an identical sin x/x type, the side lobe can be suppressed while unidirectionality is being achieved over a broad band.

Figure 4:
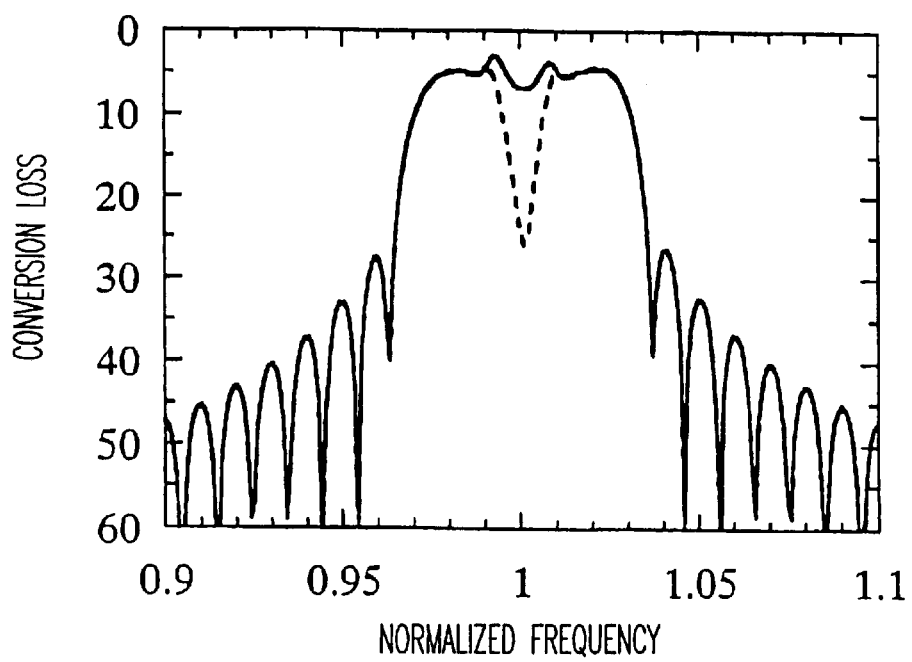
FIG. 4 is a graph that shows the conversion characteristics of yet another unidirectional transducer whose mutual-coupling coefficient and transduction coefficient have been weighted.
Figure 5:
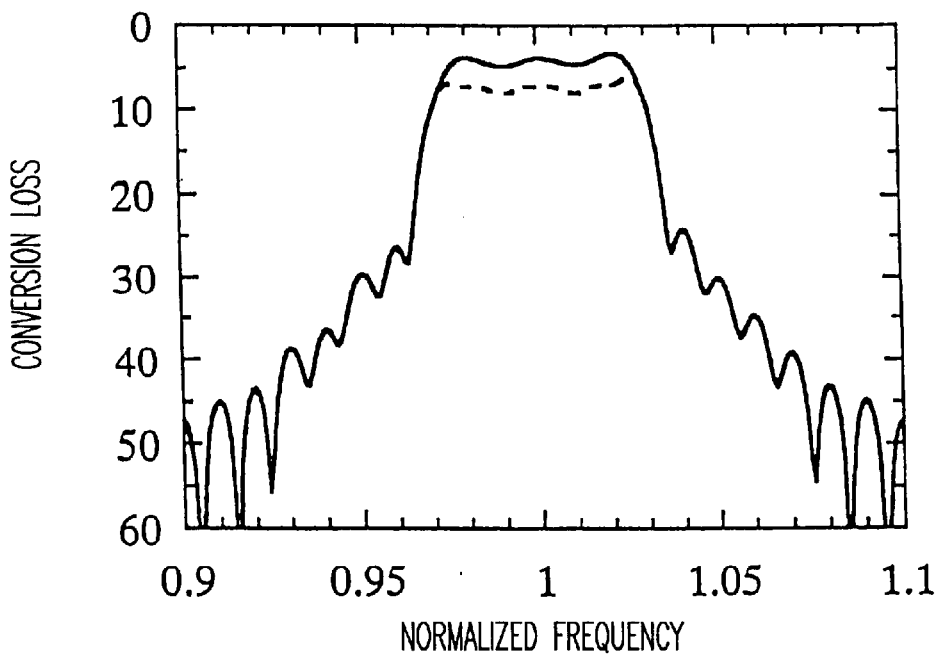
FIG. 5 is a graph that shows the conversion characteristics of yet another unidirectional transducer whose mutual-coupling coefficient and transduction coefficient have been weighted.

Next, an application example pertaining to a case where the transduction coefficient $\zeta(x)$ and the mutual-coupling coefficient $\kappa_{12}(x)$ are weighted by different sin x/x types will be explained. In the present application example, the wavelength 80, transducer length, and the aperture length were designated identically as in FIG. 1, whereas the weighting function $W_1(x)$ for the transduction coefficient $\zeta(x)$, which determines the excitation source distribution, is fixed at sin $(6\pi X)/6\pi X$, whereas the weighting function $W_2(x)$ for the mutual-coupling coefficient $\kappa_{12}(x)$, which determines the reflection source distribution, is designated at sin $(m\pi X)/m\pi X$, whereas m was designated at 2 or 10. The conversion characteristics of the case of m=2 are shown in FIG. 4, whereas the conversion characteristics of the case of m=10 are shown in FIG. 5. In each of FIGS. 4 and 5, the side lobe is suppressed while the passband is being broadened. In other words, even when the mutual-coupling coefficient and transduction coefficient are weighted by functions of different sin x/x types, the side lobe can be suppressed while the passband is being broadened. When the results of FIGS. 4 and 5 are compared with those of FIG. 1, in which n=6 holds, it can be seen that unidirectionality can be achieved over a broader band as the m value increases.

The present inventors conducted weighting experiments by using such various sin x/x types, and as a result, the results shown in Table I below were obtained when $W_1(X)=\sin(n\pi X)/n\pi X$ and $W_2(x)=\sin(m\pi X)/m\pi X$ were designated.

|  | n = 1 | n = 2 | n = 3 | n = 4 | n = 5 | n = 6 | n = 7 | n = 8 |
| --- | --- | --- | --- | --- | --- | --- | --- | --- |
| m = 1 | X | X | X | X | X | X | X | X |
| m = 2 | X | O | O | X | X | X | X | X |
| m = 3 | X | O | O | O | O | X | X | X |
| m = 4 | X | O | O | O | O | O | O | X |
| m = 5 | X | O | O | O | O | O | O | O |
| m = 6 | X | O | O | O | O | O | O | O |
| m = 7 | X | O | O | O | O | O | O | O |
| m = 8 | X | O | O | O | O | O | O | O |
| m = 9 | X | O | O | O | O | O | O | O |
| m = 10 | X | O | O | O | O | O | O | O |

Effects of suppressing the side lobe and of broadening the passband were observed in all the combinations of (m,n) shown in Table I above, of these, unidirectionality was achieved over a broader band in the combinations marked by "o" than in the combinations marked by "x."

These results indicate that, in order to achieve unidirectionality over a broad range when $\kappa_{12}(x)$ is characterized by the sin $(m\pi X)/m\pi X$ type and where $\zeta(x)$ is characterized by the sin $(n\pi X)/n\pi X$ type, combinations of m and n, which are each assumed to be real numbers of 2 or larger, which satisfy the relationship of m≧INT(n/2)+1 (wherein INT(n/2) signifies the integer segment of n/2) are desirable.

Weighting of the mutual-coupling coefficient alone

Figure 6:
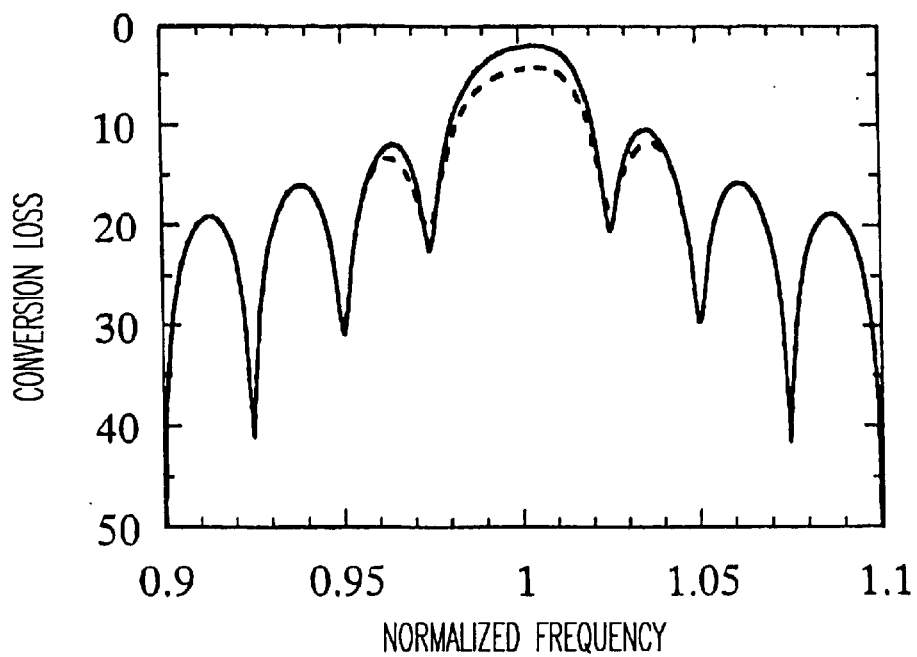
FIG. 6 is a graph that shows the conversion characteristics of a unidirectional converter whose mutual-coupling coefficient has been weighted.

The conversion characteristics of a case where sin$(6\pi X)/6\pi X$ is designated as the weighting function $W_2(X)$ of the mutual-coupling coefficient $\kappa_{12}(x)$ and where the transduction coefficient is not weighted (i.e., of $W_1(X)=1$) are shown in FIG. 6. The conditions other than the weighting function are identical to those in FIG. 1. In FIG. 6, the degree to which the side lobe is inhibited is lower than that in FIG. 1, but unidirectionality is achieved over a broad frequency range which reaches the side lobe past the passband (main lobe), and the uniformity of the unidirectionality within the passband can be seen to be high. When the uniformity of the unidirectionality is high (i.e., when the conversion loss in the backward direction is virtually constant within the passband), twin peaks of the radiation conductance of the transducer can be eradicated, which is advantageous in that the impedance match can be facilitated.

Weighting of the transduction coefficient

Figure 7:
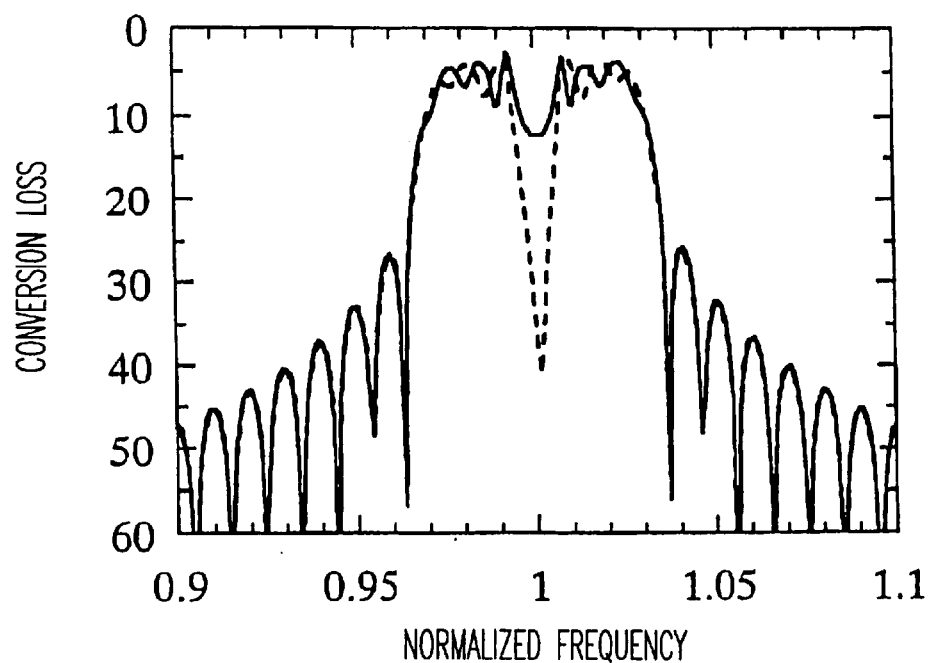
FIG. 7 is a graph that shows the conversion characteristics of a unidirectional transducer whose transduction coefficient has been weighted.

The conversion characteristics of a case where sin$(6\pi X)/6\pi X$ is designated as the weighting function $W_1(X)$ of the transduction coefficient $\zeta(x)$ and where the mutual-coupling coefficient is not weighted (i.e., case of $W_2(X)=1$) are shown in FIG. 7. The conditions other than the weighting function are identical to those in FIG. 1. In FIG. 7, unidirectionality is achieved only in the vicinity of the central frequency, but the degree to which the side lobe is suppressed is high while the passband is being concomitantly broadened.

Effects of weightings on reflection characteristics

Next, the functions and effects of weightings on a reflector (grating) were investigated for the purpose of studying the function of internal reflection in the single-phase unidirectional transducer.

Since no excitation source exists in the reflector, V=0 and I(X)=0 hold in the coupling-of-modes equations. The coupling-of-modes equations of a case where the self-coupling coefficient $\kappa_{11}$, mutual-coupling coefficient $\kappa_{12}$, transduction coefficient $\zeta$, and the phase mismatching factor $\delta$ are assumed respectively to be functions of x in the reflector can be expressed by the following formulas (4a) and (4b):

$$\frac{dA^+(x)}{dx} = -j\kappa_{11}(x)A^+(x) - j\kappa_{12}(x)e^{j2\delta(x)x}A^-(x) \quad (4a)$$

$$\frac{dA^-(x)}{dx} = j\kappa_{12}^*(x)e^{-j2\delta(x)x}A^+(x) + j\kappa_{11}(x)A^-(x) \quad (4b)$$

Figure 12:
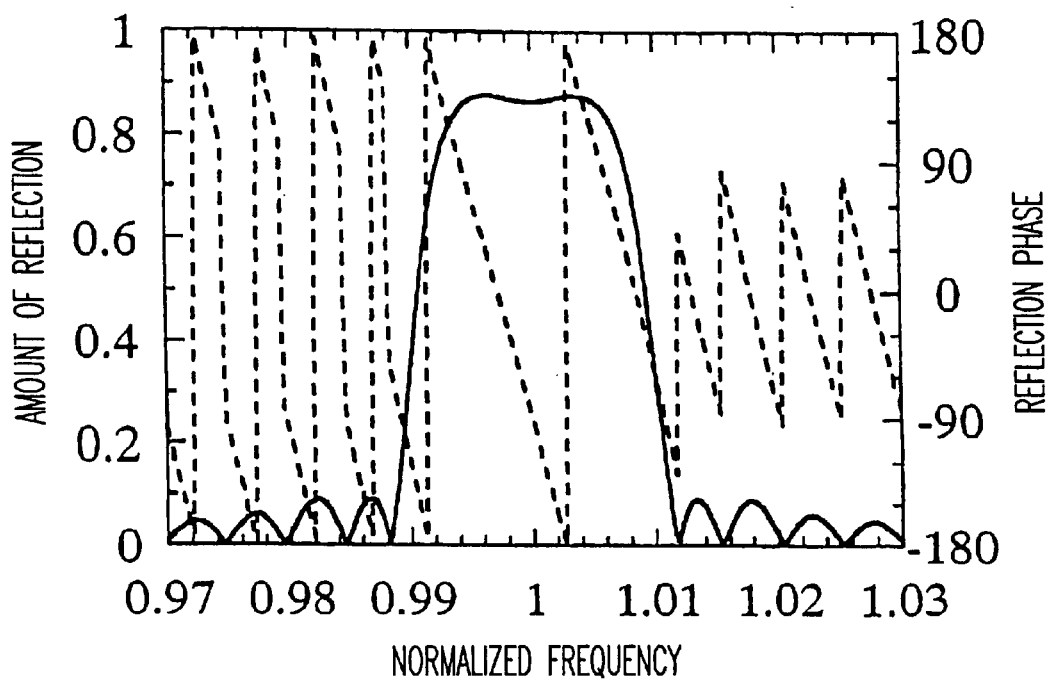
FIG. 12 is a graph that shows the reflection characteristics of a weighted reflector.
Figure 13:
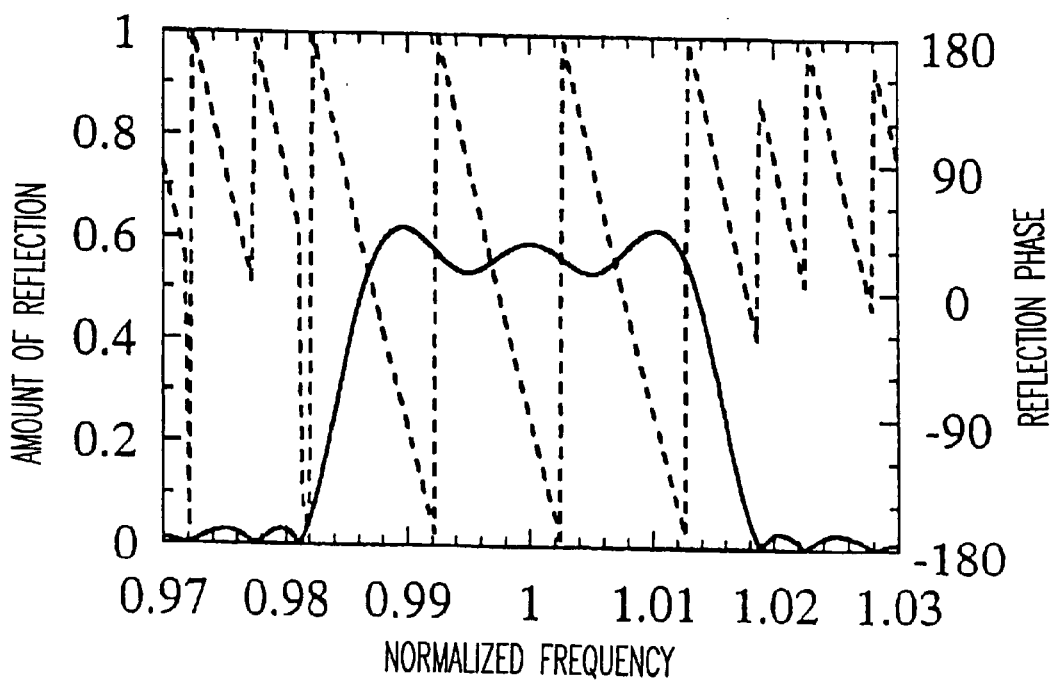
FIG. 13 is a graph that shows the reflection characteristics of another weighted reflector.
Figure 14:
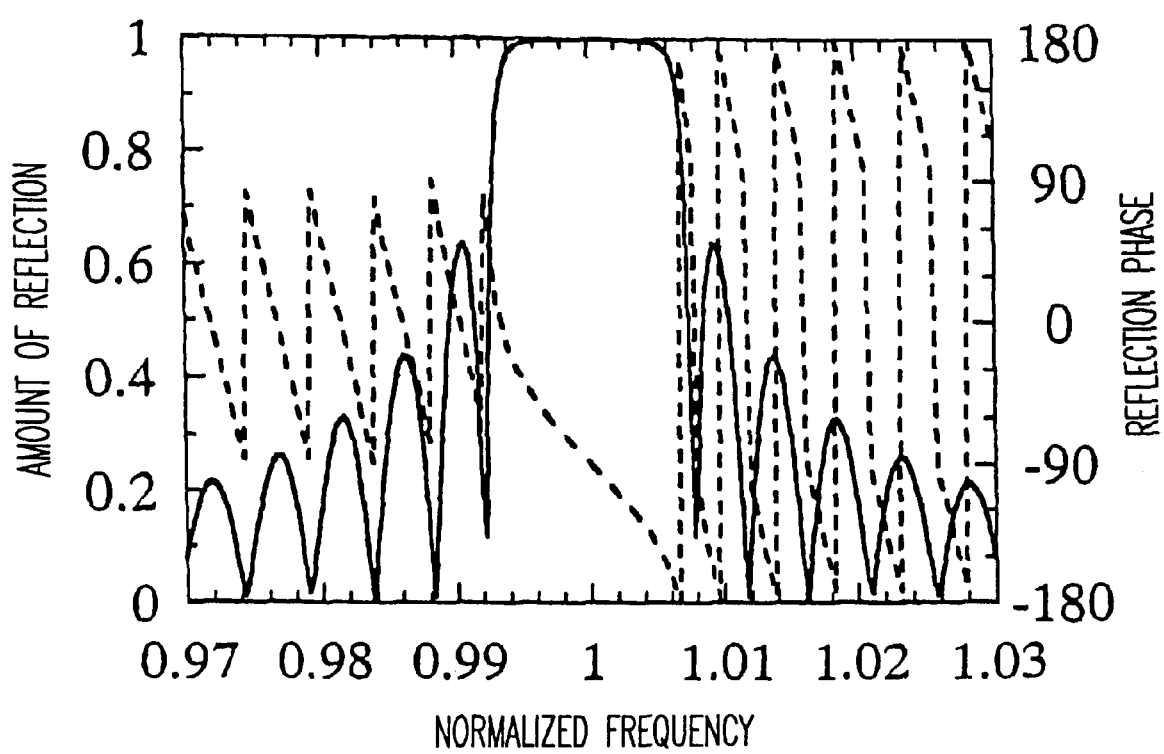
FIG. 14 is a graph that shows the reflection characteristics of an unweighted reflector.

The mutual-coupling coefficient $\kappa_{12}(X)$ should hereby be noted. The $\kappa_{12}(X)$ can be expressed by the aforementioned formula (3b). The reflection characteristics of a case where weighting procedures are carried out by assuming $W_2(X) = \sin(m\pi X)/m\pi X$ and m=3 are shown in FIG. 12, whereas the rejection characteristics of a case where weighting procedures are carried out by assuming m=6 are shown in FIG. 13. In each of these cases, the total reflector length was designated at 100 $\lambda$. For comparative reasons, furthermore, the reflection characteristics of a case where the mutual-coupling coefficient $\kappa_{12}$ is not weighted as shown in FIG. 14. In each of these figures, the solid and dotted curves respectively signify the reflection magnitude and phase of the reflector. The reflection magnitude is the absolute value of $A^-(X)/A^+(X)$, and its argument is the phase.

In FIG. 14, in which no weighting is carried out, the reflection magnitude within the stop band is approximately 1 (100% reflectance). The reflection phase, furthermore, varies by 360° in a virtually linear fashion within the stop band from +90° to −270° (+90°). Moreover, −90°, which is a reflection phase condition necessary for obtaining ordinary unidirectional transduction actions, is observed at the center of the stop band.

In contrast, the reflection magnitude diminishes when the mutual-coupling coefficient $\kappa_{12}(X)$ is weighted by the sin x/x type, and as a result, ripples are generated. Yet the variance of the reflection phase in the stop band significantly varies past 360°. In FIG. 13, in which m=6 holds, in particular, the phase angle variance increases to an extreme, and frequencies which satisfy the reflection phase condition necessary for obtaining ordinary unidirectional transduction actions 90°) are observed at multiple (i.e., 3) positions.

As has been mentioned above, unidirectionality can be achieved over a broad frequency range that extends to the side lobe in a unidirectional transducer wherein the mutual-coupling coefficient $\kappa_{12}(X)$ alone is weighted, as FIG. 6 indicates, and its reason can be inferred from the aforementioned analysis of the reflector. In other words, in the case of a unidirectional transducer which possesses an unweighted reflector, the optimal unidirectionality condition is satisfied at only one point within the passband, and accordingly, the passband is narrow, whereas in the case of a unidirectional transducer which possesses a reflection element which has been weighted according to the sin x/x type, frequencies which satisfy the optimal unidirectionality condition exist at multiple points within the passband, based on which unidirectionality is achieved over a broad range within the passband.

The present invention is also applicable to reflectors (grating) which are configured independently of excitation and reception electrodes. In such a case, not only a pair of reflectors which sandwich the excitation and reception electrodes but also a reflector configured between the excitation electrode and reception electrode are conceivable.

Weighting embodiments

The procedures for weighting the respective parameters of the mutual-coupling equations in the present invention can be embodied by adventitiously designating the constitutions of excitation and reception electrodes and/or a reflecting floating electrode in an actual transducer. The present inventors proceeded to embody the procedures for weighting the respective parameters in each of the aforementioned application examples based on the EWC (electrode width control) method, which is mentioned in P. Ventura, et al., *Proc. JEEE Ultrason. Symp.*, pp. 1–6 (1994), as a result of which it was confirmed that conversion characteristics comparable to the values calculated by the analysis method shown in FIG. 10 can be obtained. The weighting embodiments may also be based on a thickness distribution of an electrode finger or on the coating of the electrode finger with a dielectric film.

Concrete examples in which at least one member selected from between the mutual-coupling coefficient and the transduction coefficient is defined as a function of x have been explained above, although it is also possible to weight phase mismatching factor $\delta$ as a function of x (i.e., $\delta(x)$). An application to a Chirp transducer (Chirp IDT) becomes possible by weighting the phase mismatching factor. The Chirp transducer is a type of dispersion transducer in which the electrode periods continuously vary.

Effects of the Invention

As far as the design method of the present invention is concerned, direct evaluations based on numerical analyses are possible not only when the coupling-of-modes parameters of coupling-of-modes equations are weighted but also when the weighting functions for the respective parameters differ. For this reason, the degree of design freedom is high. It is, for example, useful for designing a W-CDMA IF filter, which must meet extremely broad band width and low loss requirements.

Since weights of the sin x/x type based on the coupling-of-modes equations are imposed in the surface acoustic wave device of the present invention, effects of suppressing the side lobe and of broadening the band can be achieved. When the mutual-coupling coefficient and the transduction coefficient satisfy a certain relationship, furthermore, an excellent single-phase unidirectional transducer which exhibits unidirectionality over a broad band can be without adversely affecting the rectangularity of the passband.

What is claimed is:

1. A method for manufacturing a surface acoustic wave device, comprising:

forming a single-phase unidirectional transducer above a piezoelectric substrate;

connecting said single-phase unidirectional transducer to an excitation electrode;

calculating frequency responses of positive and negative conversion losses along a surface acoustic wave propagation direction by coupling-of-modes equations expressed by:

$$\frac{dA^+(x)}{dx} = -j\kappa_{11}A^+(x) - j\kappa_{12}e^{j2\delta x}A^-(x) + j\zeta e^{j\delta x}V \quad (1a)$$

$$\frac{dA^-(x)}{dx} = j\kappa_{12}^*e^{-j2\delta x}A^+(x) + j\kappa_{11}A^-(x) - j\zeta^* e^{-j\delta x}V \quad (1b)$$

$$\frac{dI(x)}{dx} = -pj\zeta^* e^{-j\delta x}A^+(x) - pj\zeta e^{j\delta x}A^-(x) + qj\omega CV \quad (1c)$$

where $A^+(x)$ and $A^-(x)$ are the mode amplitudes of the surface acoustic waves propagated respectively in the positive direction (forward direction) and negative direction (backward direction) of the x axis, which corresponds to the surface acoustic wave propagation direction, V is an applied voltage for the excitation electrode, I(x) is a current flowing through said excitation electrode, $\kappa_{11}$, $\kappa_{12}$, $\zeta$, C, and $\delta$ are respectively the self-coupling coefficient, mutual-coupling coefficient, transduction coefficient, electrostatic capacitance per unit length, and the phase mismatching factor, the combinations of p and q in formula (1c) (p,q) include (2,1), (−2,−1), (4, 1), and (−4,−1) for determining the excitation source distribution and reflection source distribution of the single-phase unidirectional transducer, and at least one member selected from the group consisting of the self-coupling coefficient $\kappa_{11}$, mutual-coupling coefficient $\kappa_{12}$, transduction coefficient $\zeta$, and the phase mismatching factor $\delta$ is a function of x while x=0 through L holds in an analytic range of the coupling-of-modes equations and while boundary conditions of the initial and final analytical points are being respectively expressed by $A^+(0)=0$ and $A^-(L)=0$, setting $A^+(0)=0$ as a boundary condition, setting $A^-(0)$ to an arbitrary value as an initial value of $A^-(0)$, calculating formulas (1a) and (1b) while repeatedly altering $A^-(0)$ until $A^-(L)=0$, and calculating the conversion losses by computing an admittance based on formula (1c) when $A^-(L)=0$;

wherein forming said single-phase unidirectional transducer is based on said computed admittance.

2. The method for manufacturing a surface acoustic wave device specified in claim 1, wherein at least one of the mutual-coupling coefficient $\kappa_{12}$ and the transduction coefficient $\zeta$ is a function of x in the formulas (1a), (1b), and (1c).

3. The method for manufacturing a surface acoustic wave device specified in claim 2, wherein the function of x comprises sin x/x.

4. The method for manufacturing a surface acoustic wave device specified in claim 3, wherein the function comprising sin x/x involves a disparity between the mutual-coupling coefficient $\kappa_{12}$ and the transduction coefficient $\zeta$.

5. The method for manufacturing a surface acoustic wave device specified in claim 4, wherein the mutual-coupling coefficient $\kappa_{12}$ is a function comprising $\sin(m\pi x)/m\pi x$ where m and n are each real numbers of 2 or larger and where $m \geq \text{INT}(n/2)+1$ (INT(n/2) being the integer segment of n/2), and wherein the transduction coefficient $\zeta$ is a function comprising $\sin(n\pi x)/n\pi x$.

6. A surface acoustic wave device manufactured by the method for manufacturing a surface acoustic wave device specified in claim 1.

7. A method for manufacturing a surface acoustic wave device, comprising:

forming a single-phase unidirectional transducer above a piezoelectric substrate;

connecting said single-phase unidirectional transducer to an excitation electrode;

calculating frequency responses of positive and negative conversion losses along a surface acoustic wave propagation direction by coupling-of-modes equations expressed by:

$$\frac{dA^+(x)}{dx} = -j\kappa_{11}A^+(x) - j\kappa_{12}e^{j2\delta x}A^-(x) + j\zeta e^{j\delta x}V \quad (1a)$$

$$\frac{dA^-(x)}{dx} = j\kappa_{12}^* e^{-j2\delta x}A^+(x) + j\kappa_{11}A^-(x) - j\zeta^* e^{-j\delta x}V \quad (1b)$$

$$\frac{dI(x)}{dx} = -pj\zeta^* e^{-j\delta x}A^+(x) - pj\zeta e^{j\delta x}A^-(x) + qj\omega CV \quad (1c)$$

where $A^+(x)$ and $A^-(x)$ are the mode amplitudes of the surface acoustic waves propagated respectively in the positive direction (forward direction) and negative direction (backward direction) of the x axis, which corresponds to the surface acoustic wave propagation direction, V is an applied voltage for the excitation electrode, I(x) is a current flowing through said excitation electrode, $\kappa_{11}$, $\kappa_{12}$, $\zeta$, C, and $\delta$ are respectively the self-coupling coefficient, mutual-coupling coefficient, transduction coefficient, electrostatic capacitance per unit length, and the phase mismatching factor, the combinations of p and q in formula (1c) (p,q) include (2,1), (−2,−1), (4, 1), and (−4,−1) for determining the excitation source distribution and reflection source distribution of the single-phase unidirectional transducer, and at least one member selected from the group consisting of the self-coupling coefficient $\kappa_{11}$, mutual-coupling coefficient $\kappa_{12}$, transduction coefficient $\zeta$, and the phase mismatching factor $\delta$ is a function of x while x=0 through L holds in an analytic range of the coupling-of-modes equations and while boundary conditions of the initial and final analytical points are being respectively expressed by $A^+(0)=0$ and $A^-(L)=0$, setting $A^-(L)=0$ as a boundary condition, setting $A^+(L)$ to an arbitrary value as an initial value of $A^+(L)$, calculating formulas (1a) and (1b) while repeatedly altering $A^+(L)$ until $A^+(0)=0$, and calculating the conversion losses by computing an admittance based on formula (1c) when $A^+(0)=0$;

wherein forming said single-phase unidirectional transducer is based on said computed admittance.

8. The method for manufacturing a surface acoustic wave device specified in claim 7, wherein at least one of the mutual-coupling coefficient $\kappa_{12}$ and the transduction coefficient $\zeta$ is a function of x in the formulas (1a), (1b), and (1c).

9. The method for manufacturing a surface acoustic wave device specified in claim 8, wherein the function of x comprises sin x/x.

10. The method for manufacturing a surface acoustic wave device specified in claim 9, wherein the function comprising sin x/x involves a disparity between the mutual-coupling coefficient $\kappa_{12}$ and the transduction coefficient $\zeta$.

11. The method for manufacturing a surface acoustic wave device specified in claim 10, wherein the mutual-coupling coefficient $\kappa_{12}$ is a function comprising $\sin(m\pi x)/m\pi x$ where m and n are each real numbers of 2 or larger and where $m \geq \text{INT}(n/2)+1$ (INT(n/2) being the integer segment of n/2), and wherein the transduction coefficient $\zeta$ is a function comprising $\sin(n\pi x)/n\pi x$.

12. A surface acoustic wave device manufactured by the method for manufacturing a surface acoustic wave device specified in claim 7.

* * * * *